United States Patent
Stepanovic et al.

(10) Patent No.: US 11,196,436 B1
(45) Date of Patent: Dec. 7, 2021

(54) HYBRID DIGITAL-TO-ANALOG CONVERTER NON-LINEARITY CALIBRATION

(71) Applicant: Apple Inc., Cupertino, CA (US)

(72) Inventors: Dusan Stepanovic, Mountain View, CA (US); KiYoung Nam, Los Altos, CA (US); Mansour Keramat, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/027,064

(22) Filed: Sep. 21, 2020

(51) Int. Cl.
*H03M 1/10* (2006.01)

(52) U.S. Cl.
CPC ....... *H03M 1/1042* (2013.01); *H03M 1/1023* (2013.01); *H03M 1/1061* (2013.01)

(58) Field of Classification Search
CPC ............. H03M 1/1042; H03M 1/1023; H03M 1/1061; H03M 1/66; H03M 1/1052
USPC ......................................... 341/118, 120, 144
See application file for complete search history.

(56) References Cited

U.S. PATENT DOCUMENTS

| | | | |
|---|---|---|---|
| 4,459,580 A | 7/1984 | Furukawa | |
| 6,567,026 B1 | 5/2003 | Gorman | |
| 6,621,440 B2 | 9/2003 | Gorman | |
| 7,283,079 B2 | 10/2007 | Jain | |
| 7,652,606 B2 | 1/2010 | Itoh et al. | |
| 8,164,495 B2* | 4/2012 | Agi | H03M 1/1052 341/118 |
| 8,681,026 B2* | 3/2014 | Xiao | H03M 1/1047 341/118 |
| 8,717,216 B1 | 5/2014 | Motamed | |
| 10,044,367 B1 | 8/2018 | Azadet et al. | |
| 2011/0109487 A1 | 5/2011 | Agi | |
| 2014/0118081 A1 | 5/2014 | Mahoney et al. | |

OTHER PUBLICATIONS

Stepanovic et al., U.S. Appl. No. 17/027,028, entitled "Digital Pre-Distortion Compensation of Digital-To-Analog Converter Non-Linearity", filed Sep. 21, 2020, 37 pages.
Non-Final Office Action in U.S. Appl. No. 17/027,028, dated May 6, 2021, 10 pages.
Non-Final Office Action in U.S. Appl. No. 17/027,028, dated Sep. 23, 2021, 9 pages.

* cited by examiner

*Primary Examiner* — Khai M Nguyen
(74) *Attorney, Agent, or Firm* — Kowert Hood Munyon Rankin and Goetzel PC; Rory D. Rankin (57) ABSTRACT

Systems, apparatuses, and methods for performing hybrid non-linearity correction for a digital-to-analog converter (DAC) are described. A circuit includes two correction LUTs, an edge-trim DAC, and a DAC core. A lookup of a first correction LUT is performed using a portion of the most significant bits (MSBs) of a received digital input value. A first correction value, retrieved from the first correction LUT, is applied to the digital input value to generate a corrected value. The corrected value is provided to the DAC core and to a second correction LUT. A second correction value, retrieved from the second correction LUT, is compared to the first correction value. If the second correction value is different from the first correction value, the difference is provided to the edge-trim DAC to generate an analog correction which is applied to an analog output of the DAC core.

20 Claims, 9 Drawing Sheets

HYBRID DIGITAL-TO-ANALOG CONVERTER NON-LINEARITY CALIBRATION

BACKGROUND

Technical Field

Embodiments described herein relate to the field of computing systems and, more particularly, to performing hybrid digital-to-analog converter non-linearity calibration.

Description of the Related Art

Digital-to-analog converters (DACs) convert digital signals (i.e., a sequence of digital numbers) into equivalent analog signals. The analog signal generated by a DAC is typically a voltage or a current signal. DAC's are usually implemented as a collection of cells (e.g., currents, capacitors, resistors). Many variations in the implementation of DAC cells exist (e.g. unary, binary, segmented). Independent of the implementation of the cells, most DACs can be modeled as a circuit in which each bit of the DAC digital input controls a cell of the appropriate size. For example, if the least significant bit (LSB) 0 cell size is 1, bit 1 cell size should be 2, bit 2 cell size should be 4, bit 3 cell size should be 8, and so on. In general, the size of the cell corresponding to the bit n is $2^n \cdot u$, where u is the unit cell size. To reduce the area and power of the DAC, it is desirable to minimize the size of the DAC cells as much as physically possible or as much as thermal noise specifications allow. This, however, increases random mismatches between DAC cells creating nonlinear errors.

SUMMARY

Systems, apparatuses, and methods for performing hybrid digital-to-analog converter (DAC) non-linearity calibration are contemplated. In one embodiment, a hybrid DAC non-linearity circuit includes two correction LUTs, an edge-trim DAC, and a DAC core. The circuit receives a digital input value, and a lookup of a first correction LUT is performed using a portion of the most significant bits (MSBs) of the digital input value. A first correction value is retrieved from the lookup to the first correction LUT, and the first correction value is applied to the digital input value to generate a corrected digital input value. The corrected digital input value is then provided to the DAC core. Also, a portion of the MSBs of the corrected digital input value are used to perform a lookup of the second correction LUT. A second correction value is retrieved from the lookup to the second correction LUT, and the second correction value is compared to the first correction value. If the second correction value is different from the first correction value, the difference is provided to the edge-trim DAC, and the edge-trim DAC generates a corresponding correction which is applied to the analog output of the DAC core. The above approach helps to reduce non-linearities introduced by the DAC core.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to"

perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Figure 1:
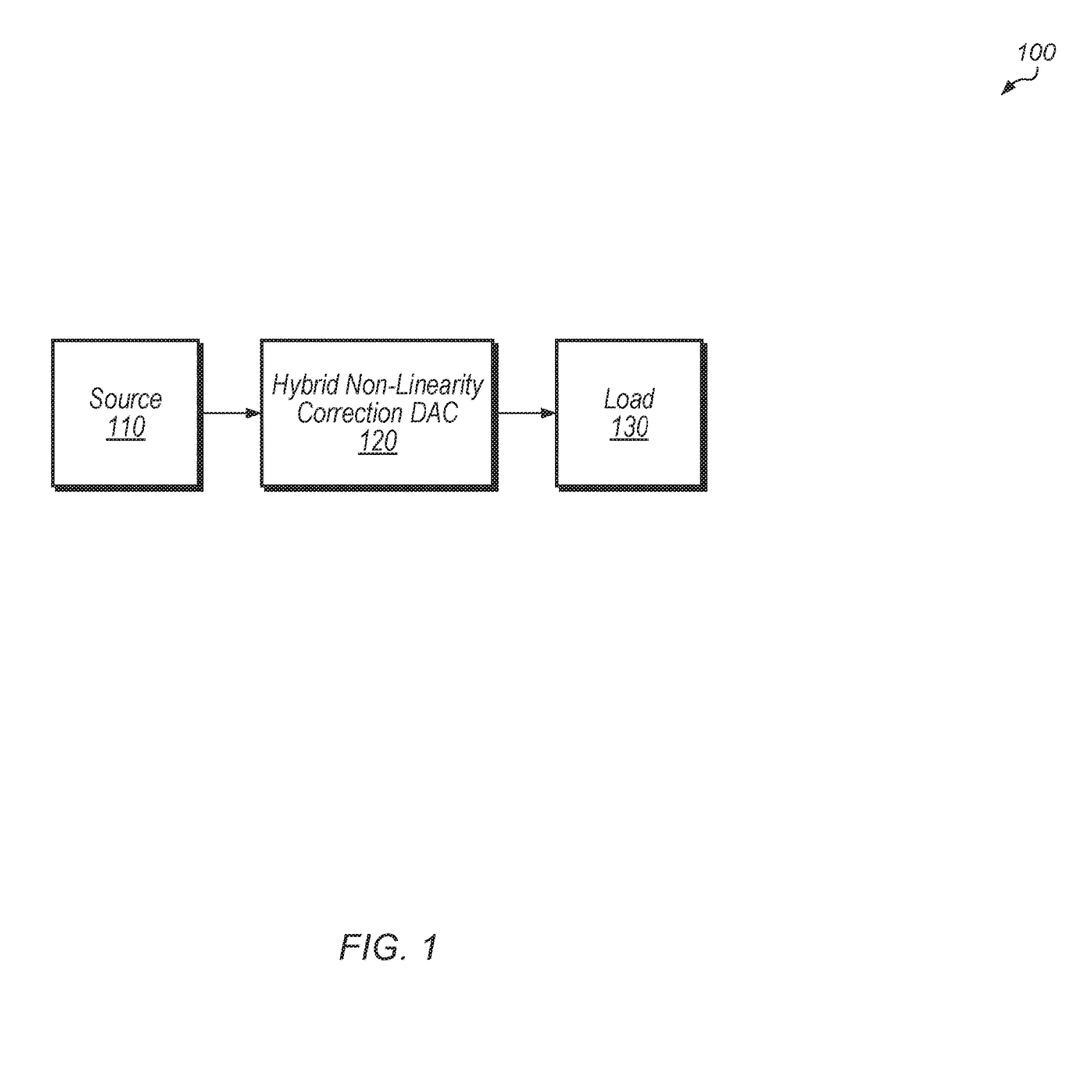
FIG. 1 is a generalized block diagram of one embodiment of an integrated circuit (IC).

Referring to FIG. 1, a block diagram of one embodiment of an integrated circuit (IC) 100 is shown. In one embodiment, IC 100 includes source 110, hybrid non-linearity correction DAC 120, and load 130. In some embodiments, the components of IC 100 may actually be located in two or more separate IC's. Additionally, it should be understood that IC 100 may also include any number of other components (e.g., voltage regulator, capacitors, resistors) which are not shown to avoid obscuring the figure.

Source 110 is representative of any type of processing unit, control logic, memory device, or circuitry that provides digital input values to DAC 120. DAC 120 includes a hybrid non-linearity correction circuit to correct for conversion non-linearities in the digital domain and conditionally in the analog domain. In general, the hybrid non-linearity correction circuit includes first circuitry for applying digital correction to a digital input value and second circuitry for applying analog correction to an analog output of DAC 120. Examples of different embodiments of hybrid non-linearity correction circuits will be presented throughout the remainder of this specification. Load 130 is representative of any type of circuit or logic for receiving the analog output generated by DAC 120. In one embodiment, the analog output may be processed and conveyed to another circuit or device after being received by load 130.

Figure 2:
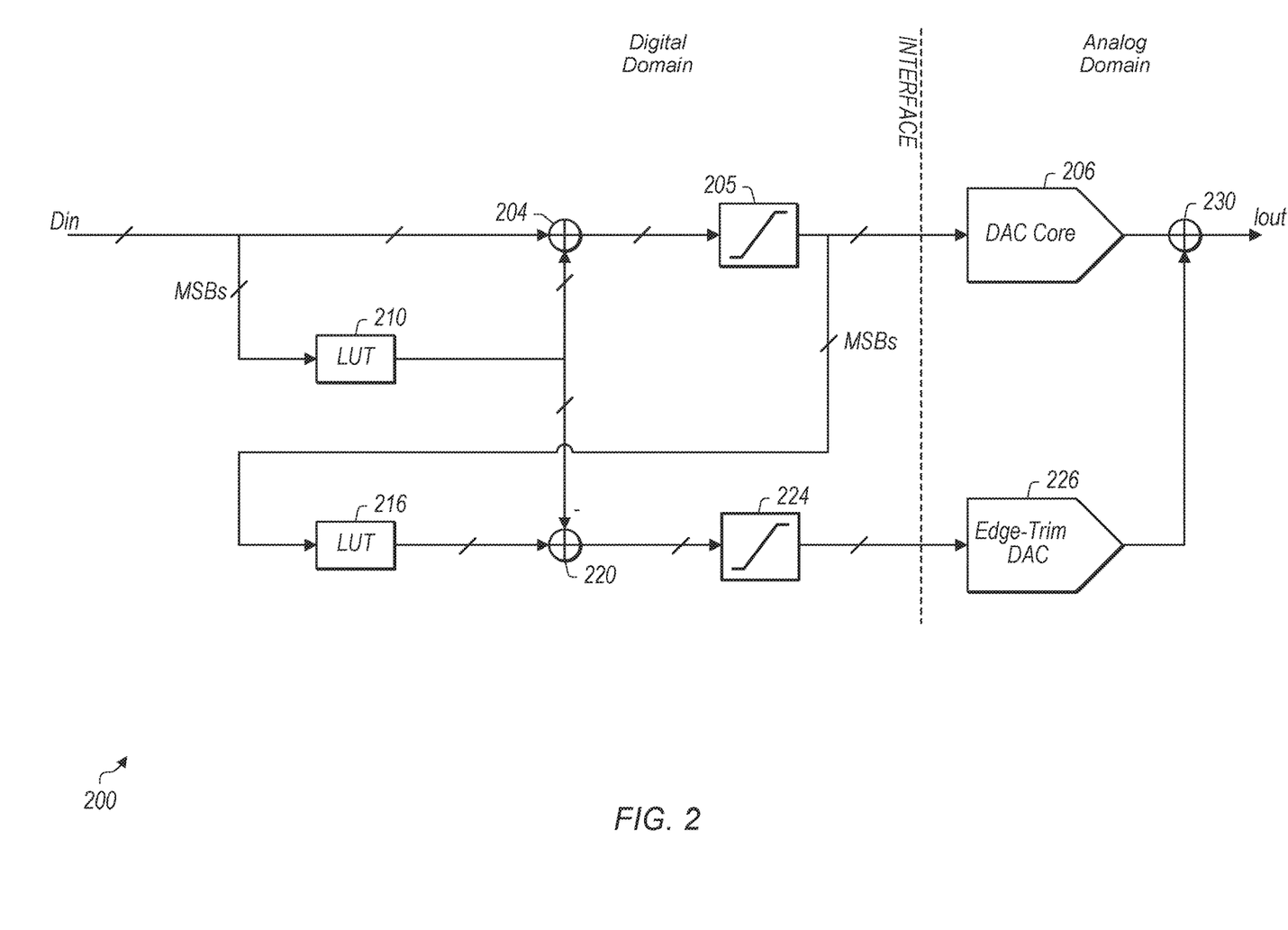
FIG. 2 is a generalized block diagram illustrating one embodiment of a hybrid DAC non-linearity correction circuit.

Turning now to FIG. 2, a block diagram of one embodiment of a hybrid DAC non-linearity correction circuit 200 is shown. Hybrid DAC non-linearity correction circuit 200 receives a digital input $D_{in}$ which is to be converted to an analog value by DAC core 206. The digital input $D_{in}$ is may have any number of bits, with the number of bits varying according to the embodiment. In order to correct for non-linearities of DAC core 206, the most significant bits (MSBs) of the digital input $D_{in}$ are provided to first storage entity 210. In various embodiments, the storage entity 210 is a lookup table, though entities and structures other than a table are possible and are contemplated. For ease of discussion, the description will refer to the storage entity, and other similar entities, as a lookup table (LUT). The number of MSBs that are provided to first LUT 210 may vary according to the embodiment. The first LUT 210 includes correction codes for correcting for non-linear errors introduced by DAC core 206. The correction code output of first LUT 210 is coupled to adder 204 and subtractor 220. Adder 204 adds the correction code output from first LUT 210 to the original digital input $D_{in}$. The sum produced by adder 204 is the digitally corrected input which is optionally clipped by clipping unit 205 and then provided to DAC core 206.

In one embodiment, the whole range of digital input $D_{in}$ values are split into segments, and each segment has a corresponding correction code stored in first LUT 210. Each correction code is correlated to the middle of the corresponding segment. Accordingly, when a digital input $D_{in}$ value falls near the middle of a segment, the correction code stored in first LUT 210 is able to accurately offset the non-linearities introduced by DAC core 206. However, when a digital input $D_{in}$ value is close to the edge of a segment, the correction can be non-optimal. In some cases, the correction code from first LUT 210 that is applied to the original digital input $D_{in}$ value can cause the corrected value that is applied to DAC core 206 to end up in a different segment. In these cases, edge-trim DAC 226 will be activated to fix the remaining uncorrected part of the error.

To mitigate cases where the digital input $D_{in}$ value is near the edge of a segment, some portion of the MSBs of the output of clipping unit 205 are provided to second LUT 216. In one embodiment, second LUT 216 has the identical stored values as first LUT 210. In other words, the entries of second LUT 216 match the entries of first LUT 210. After performing a lookup of second LUT 216 with the MSBs of the corrected digital input $D_{in}$ value, the result of the lookup to second LUT 216 is provided to subtractor 220. Subtractor 220 compares the output of second LUT 216 with the output of first LUT 210. The difference between the LUTs is optionally clipped by clipping unit 224 and then provided as an input to edge-trim DAC 226. In one embodiment, the bit-width of the input to edge-trim DAC 226 and the number of bits used for the lookup of LUTs 210 and 216 are determined based on the amount of mismatches in DAC core 206.

The output of edge trim DAC 226 is provided to adder 230 which operates in the analog domain. If the output of second LUT 216 is equal to the output of first LUT 210, then the output of subtractor 220 will be zero. This will cause the input to edge trim DAC 226 to be zero, which will result in edge-trim DAC 226 not being activated. However, if there is a difference between the outputs of LUTs 210 and 216, then edge-trim DAC 226 will be activated and output a non-zero value to adder 230 to be applied to the analog output of DAC core 206. This approach helps to offset for the uncorrected errors that occur when the digital input $D_{in}$ value is mapped relatively close to a boundary between two adjacent correction codes of first LUT 210.

Figure 3:
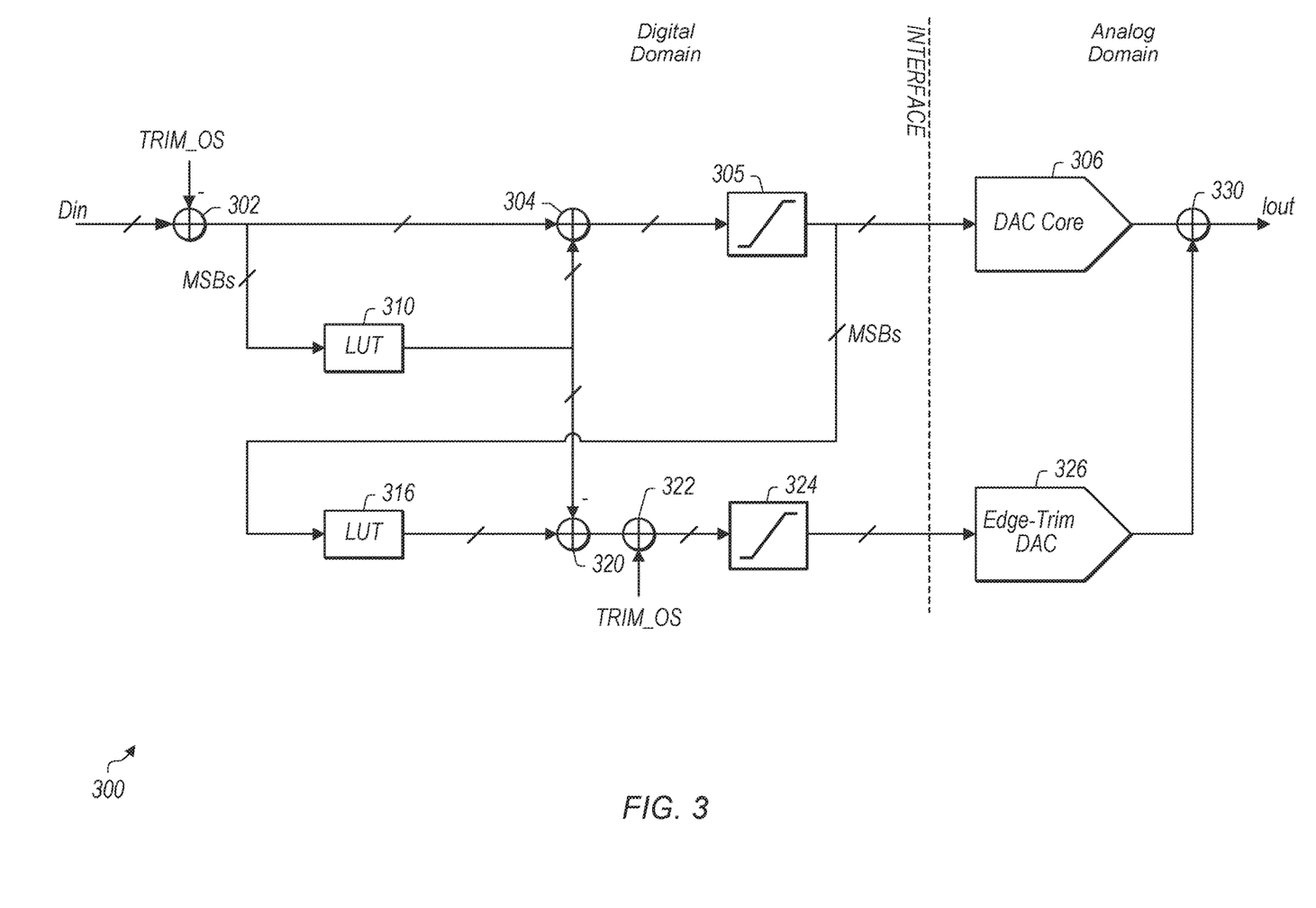
FIG. 3 is a generalized block diagram illustrating one embodiment of a hybrid DAC non-linearity correction circuit.

Referring now to FIG. 3, a block diagram of one embodiment of a hybrid DAC non-linearity correction circuit 300 is shown If the input bit-width to edge-trim DAC 326 is increased to too high of a number, this can result in an unacceptable level of out-of-band (OOB) distortions. Reducing OOB distortions is important in wireless communication applications as well as in other applications. This is a consequence of the differential non-linearity (DNL) for the middle code of edge-trim DAC 326 being the largest of any code. Also, the DNL increases with the number of input bits to edge-trim DAC 326.

To compensate for this performance degradation, a small offset (or TRIM_OS) can be added in the edge-trim path by adder 322. This offset is added to the output of subtractor 320. Similar to the circuit 200 (of FIG. 2), subtractor 320 calculates the difference between the output of LUT 316 and the output of LUT 310. The same amount of offset is subtracted by unit 302 from the main path prior to the lookup of LUT 310 and prior to adder 304. If the offset is set to ⅛ of the full scale of edge-trim DAC 326, the correction range is reduced by 25% but DNL and OOB distortions are likely to be improved. The remainder of circuit 300 remains the same as circuit 200 (of FIG. 2). For example, clipping units 305 and 324, DAC core 306, and adder 330 are the equivalent of the corresponding components in circuit 200.

Figure 4:
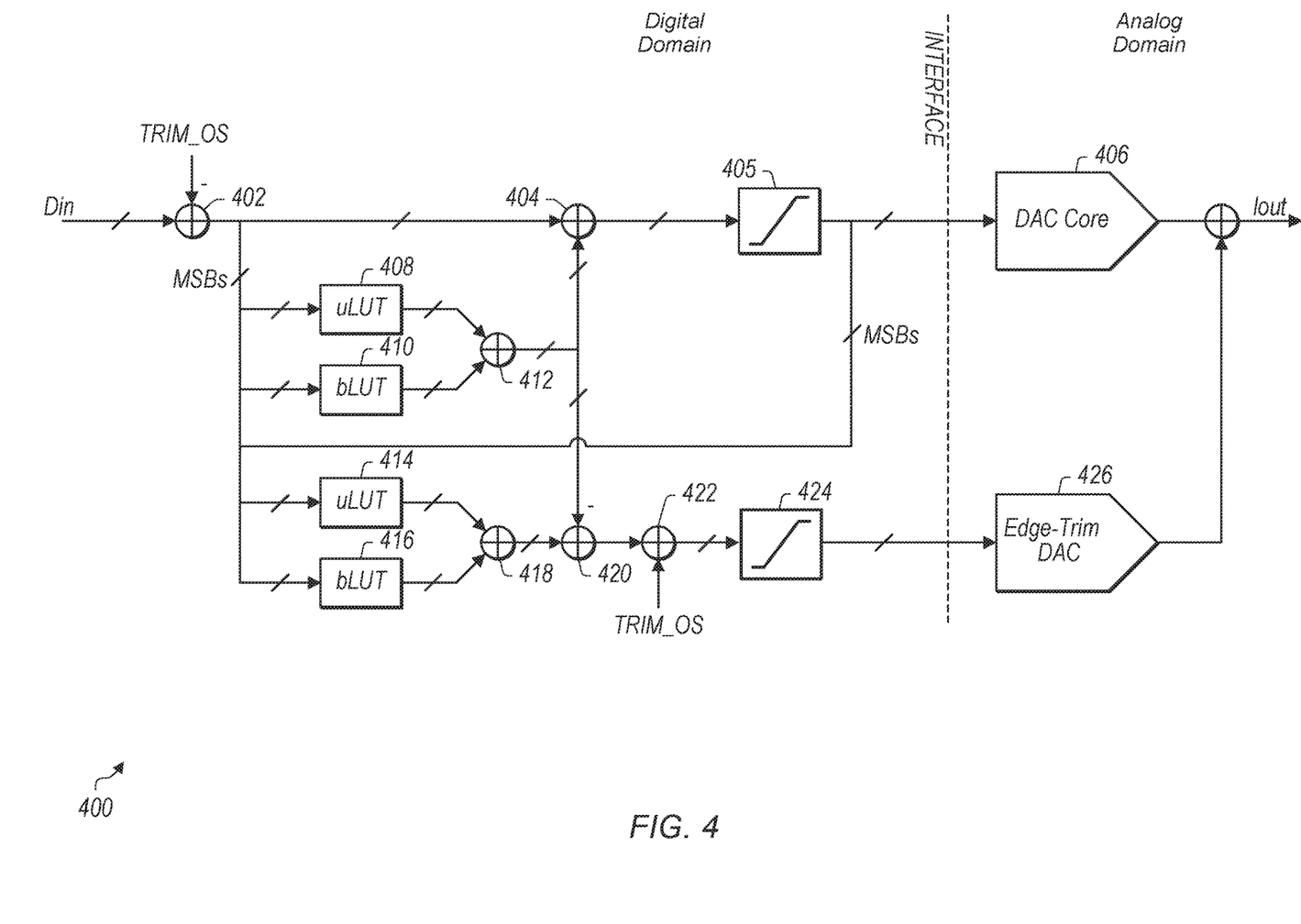
FIG. 4 is a generalized block diagram illustrating one embodiment of a hybrid DAC non-linearity correction circuit.

Turning now to FIG. 4, a block diagram of one embodiment of a hybrid DAC non-linearity correction circuit 400 is shown. For higher bit-widths of inputs to LUTs of hybrid DAC non-linearity correction circuits, the sizes of the LUTs can increase substantially which can take up a large area of the overall apparatus or system. For example, a LUT with a 9-bit input has 512 elements. Accordingly, to achieve a reduction in the size of a LUT, the LUT can be implemented as a mix of unary and binary segments. For example, the first LUT of circuit 400 can be implemented as a combination of unary LUT (or uLUT) 408 and binary LUT (or bLUT) 410. The adder 412 adds the output of uLUT 408 with the output of bLUT 410. Also, the second LUT of circuit 400 can be implemented as a combination of uLUT 414 and bLUT 416. The adder 418 adds the output of uLUT 414 with the output of bLUT 416. In one embodiment, the uLUT's 408 and 414 have a 6-bit input while bLUT's 410 and 416 have a 7-bit input. This allows the LUT's to be separated into smaller LUT's, one for the unary LUT and one for the binary LUT. Instead of a 512-element LUT for a single LUT for an embodiment that evaluates 9 MSBs of the input value, the dual-LUT has a 64-element uLUT and an 8-element bLUT. In this case, the reduction in memory size is more than seven times. The remainder of the components 402, 404, 405, 406, 420, 422, 424, and 426 are the equivalent of the corresponding components of circuit 300 (of FIG. 3).

Figure 5:
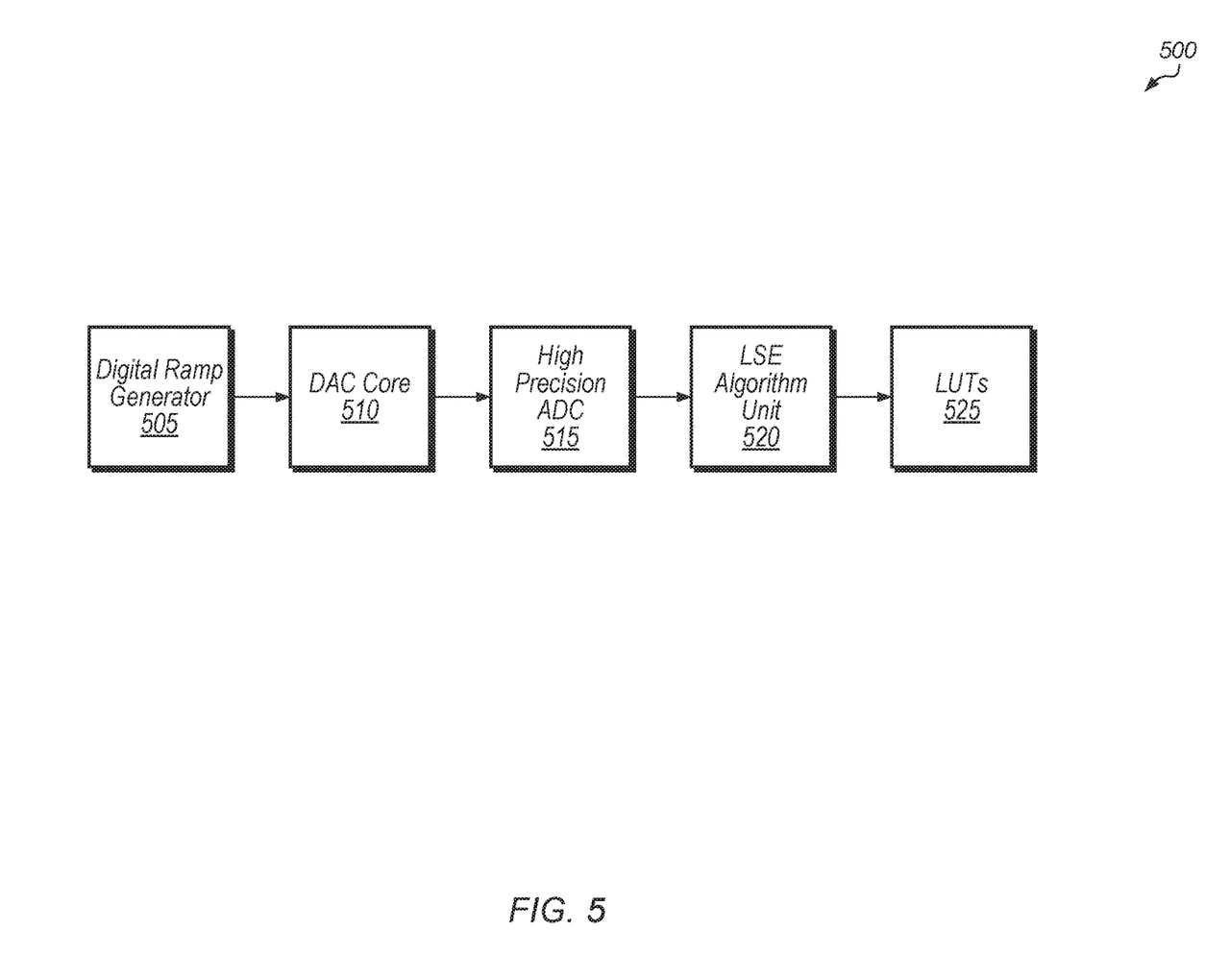
FIG. 5 is a block diagram of one embodiment of a calibration system.

Referring now to FIG. 5, a block diagram of one embodiment of a calibration system 500 is shown. In one embodiment, calibration system 500 includes digital ramp generator 505, DAC core 510, high-precision analog-to-digital converter (ADC) 515, least squares error (LSE) algorithm unit 520, and lookup tables (LUTs) 525. In other embodiments, calibration system 500 may include other components and/or be structured differently than is shown in FIG. 5. For example, in another embodiment, high-precision ADC 515 is replaced with a multimeter. It is noted that LSE algorithm unit 520 may be implemented using any suitable combination of software (e.g., program instructions) and/or hardware (e.g., control logic). It should be understood that in other embodiments, other types of algorithms besides a LSE algorithm may be used in calibration system 500.

In one embodiment, digital ramp generator 505 generates a subset of input codes uniformly spaced across the full input range of DAC core 510. In some embodiments, at least one code per unary segment is used for calibration. Typically, more than one code per each unary segment is used to average noise and second order effects. In one embodiment, codes with all possible combinations of binary bits (input to a bLUT) are exercised, typically each one is exercised multiple times and approximately uniformly distributed across the input range. In another embodiment, a portion of the possible combinations of unary and binary segments are utilized, which can significantly reduce the calibration time.

The relationship between the DAC inputs and the corresponding measured outputs (for one particular embodiment with a 10-bit DAC, 256 measured levels, and desired sizes of uLUT and bLUT of 64 and 8 entries, respectively) can be modeled as: $G \times D_{in,i} + O_u(D_{in,i}[11:6]) + O_b(D_{in,i}[5:3]) = V_{out,i}$, where i=0 . . . 255. In this equation, $D_{in}[11:6]$ are the 6 MSBs of the DAC input and $D_{in}[5:3]$ are the 3 MSBs of the binary part of the DAC input. Also, in this equation, G is the gain and $O_u$ and $O_b$ are unary and binary code-dependent offsets. In matrix form, this relationship can be written as: $A \cdot GO = V_{out}$, where GO is the 73×1 vector of gain and input-dependent offsets and A is the matrix containing input codes in the first column and zeros and ones in other columns as appropriate. $V_{out}$ is a column vector with measured DAC outputs.

In one embodiment, an overdetermined system of equations is solved using constrained least square optimization. In this embodiment, the constraints are placed on the magnitude of $O_u$ and $O_b$ based on the expected amount of random mismatches. Constraints are applicable if the number of LUT inputs is greater or equal to the number of bits in the unary DAC. In one embodiment, the correction values that are stored in the uLUT are calculated as: $uLUT(j) = -O_u(j)/G$, where j=0 . . . 63. Also, in one embodiment, the correction values that are stored in the bLUT are calculated as: $bLUT(k) = -O_b(k)/G$, where k=0 . . . 7.

Figure 6:
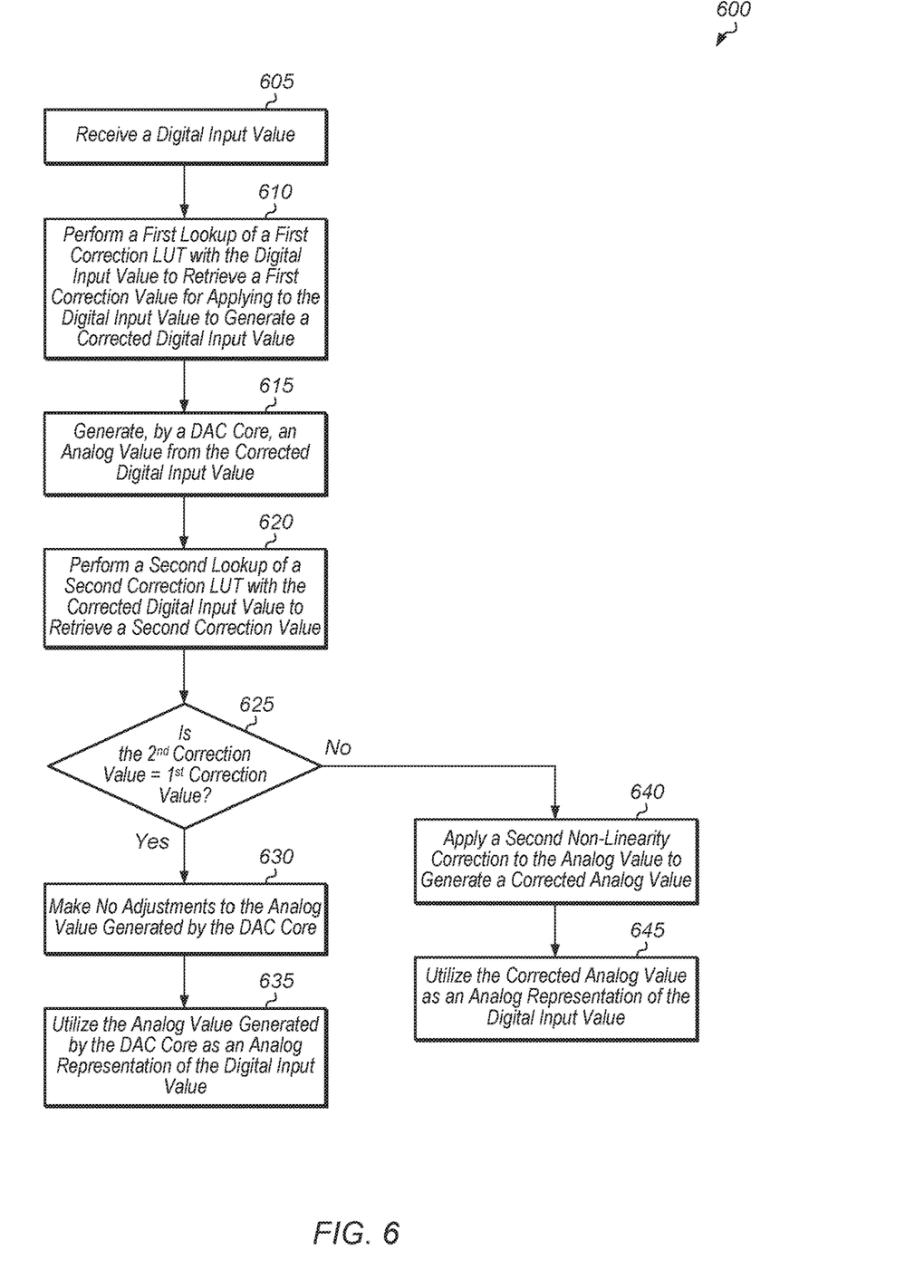
FIG. 6 is a flow diagram of one embodiment of a method for performing hybrid non-linearity correction for a DAC.

Turning now to FIG. 6, a generalized flow diagram of one embodiment of a method 600 for performing hybrid non-linearity correction for a DAC is shown. For purposes of discussion, the steps in this embodiment (as well as for FIGS. 7 and 8) are shown in sequential order. However, in other embodiments some steps may occur in a different order than shown, some steps may be performed concurrently, some steps may be combined with other steps, and some steps may be absent.

A hybrid non-linearity DAC correction circuit receives a digital input value (block 605). The circuit performs a first lookup of a first correction LUT with the digital input value to retrieve a first correction value for applying to the digital input value to generate a corrected digital input value (block 610). Next, a DAC core generates an analog value from the corrected digital input value (block 615). Also, the circuit performs a second lookup of a second correction LUT with the corrected digital input value to retrieve a second correction value (block 620).

If the second correction value is equal to the first correction value (conditional value 625, "yes" leg), then no adjustments are made to the analog value generated by the DAC core (block 630). Next, the analog value generated by the DAC core is utilized as an analog representation of the digital input value (block 635). After block 635, method 600 ends. Otherwise, if the second correction value is not equal to the first correction value (conditional value 625, "no" leg), then a second non-linearity correction is applied to the analog value to generate a corrected analog value (block 640). Next, the corrected analog value is utilized as an analog representation of the digital input value (block 645). After block 645, method 600 ends.

Figure 7:
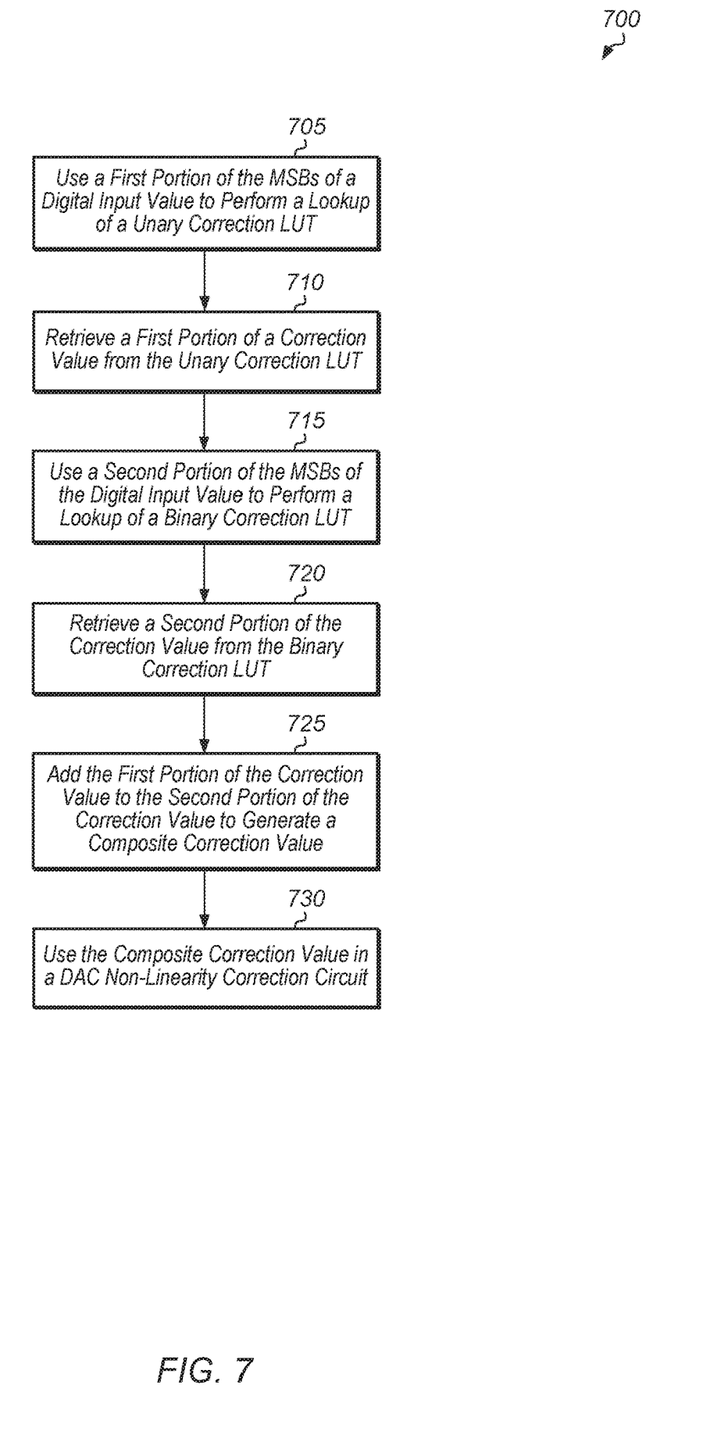
FIG. 7 is a flow diagram of one embodiment of a method for using unary and binary LUTs for performing non-linearity correction for a DAC.

Referring now to FIG. 7, one embodiment of a method 700 for using unary and binary LUTs for performing non-linearity correction for a DAC is shown. A first portion of the MSBs of a digital input value are used to perform a lookup of a unary correction LUT (block 705). A first portion of a correction value is retrieved from the unary correction LUT (block 710). Also, a second portion of the MSBs of the digital input value are used to perform a lookup of a binary correction LUT (block 715). Next, a second portion of the correction value is retrieved from the binary correction LUT (block 720). Then, the first portion of the correction value is added to the second portion of the correction value to generate a composite correction value (block 725). The composite correction value is then used in a DAC non-linearity correction circuit (e.g., circuit 200 of FIG. 2) (block 730). After block 730, method 700 ends. In one embodiment, method 700 is performed for blocks 610 and 620 of method 600 (of FIG. 6).

Figure 8:
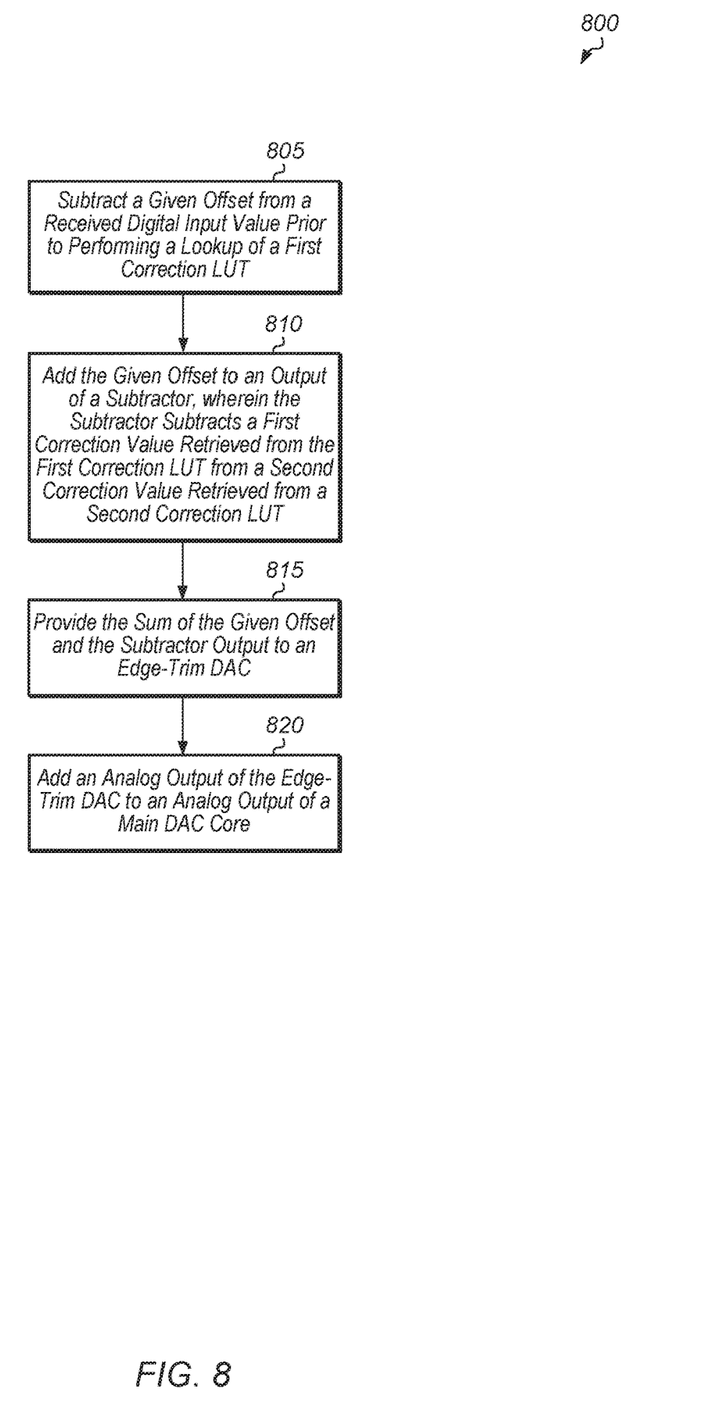
FIG. 8 is a flow diagram of one embodiment of a method for reducing non-linearities from an edge-trim DAC.

Turning now to FIG. 8, one embodiment of a method 800 for reducing non-linearities from of an edge-trim DAC is shown. A given offset is subtracted from a received digital input value prior to performing a lookup of a first correction LUT (block 805). Also, the given offset is added to an output of a subtractor (e.g., subtractor 320 of FIG. 3), wherein the subtractor subtracts a first correction value retrieved from the first correction LUT from a second correction value retrieved from a second correction LUT (block 810). The sum of the given offset and the subtractor output is provided to an edge-trim DAC (block 815). An analog output of the edge-trim DAC is added to an analog output of a main DAC core (block 820). After block 820, method 800 ends. By performing method 800, the non-linearities of the edge-trim DAC can be reduced.

Figure 9:
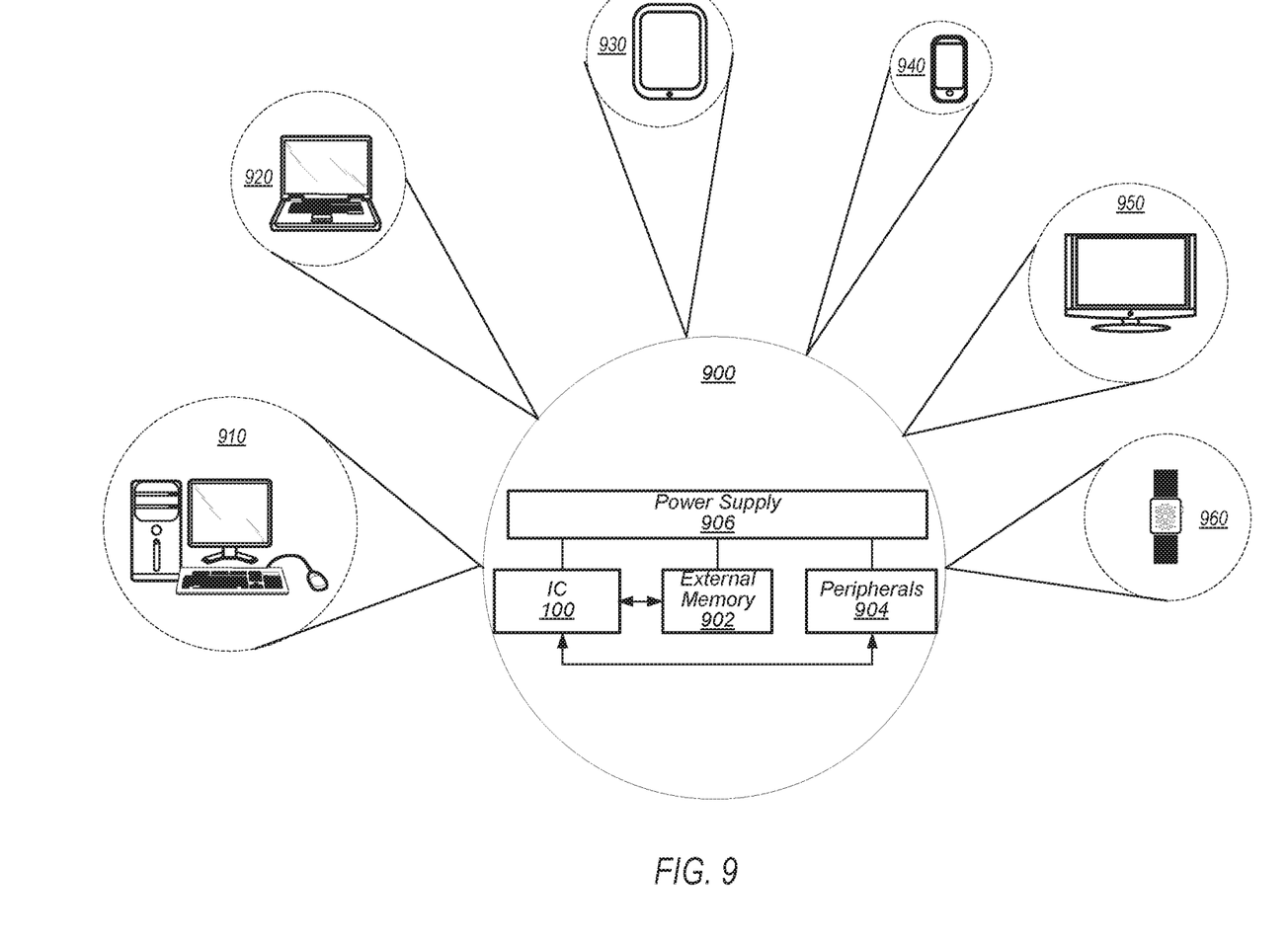
FIG. 9 is a block diagram of one embodiment of a system.

Referring now to FIG. 9, a block diagram of one embodiment of a system 900 is shown. As shown, system 900 may represent chip, circuitry, components, etc., of a desktop computer 910, laptop computer 920, tablet computer 930, cell or mobile phone 940, television 950 (or set top box configured to be coupled to a television), wrist watch or other wearable item 960, or otherwise. Other devices are possible and are contemplated. In the illustrated embodiment, the system 900 includes at least one instance of integrated circuit (IC) 100 (of FIG. 1) coupled to one or more peripherals 904 and the external memory 902. A power supply 906 is also provided which supplies the supply voltages to IC 100 as well as one or more supply voltages to the memory 902 and/or the peripherals 904. In various embodiments, power supply 906 may represent a battery (e.g., a rechargeable battery in a smart phone, laptop or tablet computer). In some embodiments, more than one instance of IC 100 may be included (and more than one external memory 902 may be included as well).

The memory 902 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RANI (SRAM), etc. One or more memory devices may be coupled onto a circuit board to form memory modules such as single inline memory modules (SIMMs), dual inline memory modules (DIMMs), etc. Alternatively, the devices may be mounted with IC 100 in a chip-on-chip configuration, a package-on-package configuration, or a multi-chip module configuration.

The peripherals 904 may include any desired circuitry, depending on the type of system 900. For example, in one embodiment, peripherals 904 may include devices for various types of wireless communication, such as wifi, Bluetooth, cellular, global positioning system, etc. The peripherals 904 may also include additional storage, including RAM storage, solid state storage, or disk storage. The peripherals 904 may include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
   first circuitry configured to:
      determine a first correction value based on a received digital input value;
      generate a corrected digital input value based on the first correction value;
      determine a second correction value based on the corrected digital input value; and
   second circuitry configured to apply a correction to an analog output of a digital-to-analog (DAC) core, responsive to determining that the second correction value does not equal the first correction value.

2. The circuit as recited in claim 1, wherein the first correction value is retrieved from a first correction lookup table (LUT) using a first number of most significant bits (MSB's) of the received digital input value, and wherein the second correction value is retrieved from a second correction LUT using a first number of MSB's of the corrected digital input value.

3. The circuit as recited in claim 2, wherein the first circuitry is further configured to:
   subtract a given offset from the received digital input value prior to performing a lookup of the first LUT;
   calculate a difference between the first correction value and the second correction value; and
   add the given offset to the difference to generate the correction.

4. The circuit as recited in claim 1, wherein a magnitude of the correction is calculated based on a difference between the second correction value and the first correction value.

5. The circuit as recited in claim 1, further comprising an edge-trim DAC, wherein the correction is generated by the edge-trim DAC.

6. The circuit as recited in claim 1, wherein a plurality of entries of the second LUT match a plurality of entries of the first LUT, and wherein the DAC core is configured to generate the analog output from the corrected digital input value.

7. The circuit as recited in claim 1, wherein applying the first correction to the received digital input value comprises adding, with a digital adder, the first correction value to the received digital input value.

8. A method comprising:
  performing a first lookup of a first correction LUT with a received digital input value to retrieve a first correction value;
  applying, with the first correction value, a first correction to the received digital input value to generate a corrected value;
  performing a second lookup of a second correction LUT with the corrected value to retrieve a second correction value; and
  applying a second correction to an analog output of the DAC core responsive to determining the second correction value does not equal the first correction value.

9. The method as recited in claim 8, wherein the first lookup of the first correction LUT is performed using a first number of most significant bits (MSB's) of the digital input value, and wherein the second lookup of the second correction LUT is performed using a first number of MSB's of the corrected value.

10. The method as recited in claim 9, further comprising:
  subtracting a given offset from the received digital input value prior to performing a lookup of the first correction LUT;
  calculating a difference between the first correction value and the second correction value; and
  adding the given offset to the difference to generate the second correction.

11. The method as recited in claim 8, wherein a magnitude of the second correction is calculated based on a difference between the second correction value and the first correction value.

12. The method as recited in claim 8, further comprising generating, by an edge-trim DAC, the second correction to apply to the analog output of the DAC core.

13. The method as recited in claim 8, further comprising generating, by the DAC core, the analog output from the corrected value, and wherein a plurality of entries of the second LUT match a plurality of entries of the first LUT.

14. The method as recited in claim 8, wherein applying the first correction to the received digital input value comprises adding, with a digital adder, the first correction value to the received digital input value.

15. A system comprising:
  a digital-to-analog converter (DAC); and
  a hybrid correction circuit configured to:
    perform a first lookup of a first correction LUT with a received digital input value to retrieve a first correction value;
    apply, with the first correction value, a first correction to the received digital input value to generate a corrected value;
    perform a second lookup of a second correction LUT with the corrected value to retrieve a second correction value; and
    apply a second correction to an analog output of the DAC responsive to determining the second correction value does not equal the first correction value.

16. The system as recited in claim 15, wherein the first lookup of the first correction LUT is performed using a first portion of most significant bits (MSB's) of the digital input value, and wherein the second lookup of the second correction LUT is performed using a first portion of MSB's of the corrected value.

17. The system as recited in claim 16, wherein the first circuitry is further configured to:
  subtract a given offset from the received digital input value prior to performing a lookup of the first correction LUT;
  calculate a difference between the first correction value and the second correction value; and
  add the given offset to the difference to generate the second correction.

18. The system as recited in claim 15, wherein a magnitude of the second correction is calculated based on a difference between the second correction value and the first correction value.

19. The system as recited in claim 15, further comprising an edge-trim DAC, wherein the second correction is generated by the edge-trim DAC.

20. The system as recited in claim 15, wherein a plurality of entries of the second LUT match a plurality of entries of the first LUT, and wherein the DAC is configured to generate the analog output from the corrected value.

* * * * *